United States Patent [19]
Peguet et al.

[11] Patent Number: 4,965,473
[45] Date of Patent: Oct. 23, 1990

[54] EPROM LOW VOLTAGE SENSE AMPLIFIER

[75] Inventors: Pascal Peguet, Ville-La-Grand; Eric Boulian, Grand-Lancy; Jean-Claude Tarbouriech, Ville-La-Grand, all of France

[73] Assignee: Motorola, Inc., Schaumburg, Ill.

[21] Appl. No.: 381,354

[22] Filed: Jul. 18, 1989

[30] Foreign Application Priority Data

Jul. 23, 1988 [GB] United Kingdom ............... 8817608

[51] Int. Cl.$^5$ ............................................. H03K 5/153
[52] U.S. Cl. .................................. 307/530; 307/296.5; 365/181; 365/203; 365/226
[58] Field of Search .................. 307/530, 296.1, 296.3, 307/296.5; 365/104, 177, 181, 203, 226

[56] References Cited

U.S. PATENT DOCUMENTS 4,802,138  1/1989  Shimamune ..................... 307/530
4,837,465  6/1989  Rubinstein ...................... 307/530

*Primary Examiner*—John Zazworsky
*Attorney, Agent, or Firm*—Charles R. Lewis

[57] ABSTRACT

There is described a low voltage sense amplifier for an EPROM memory transistor which has a low voltage inverter coupled to the memory transistor. The inverter receives a selectable low reference voltage as its power supply and the same reference voltage is fed as a precharge voltage, prior to reading an EPROM bit, to the input of the inverter.

8 Claims, 1 Drawing Sheet

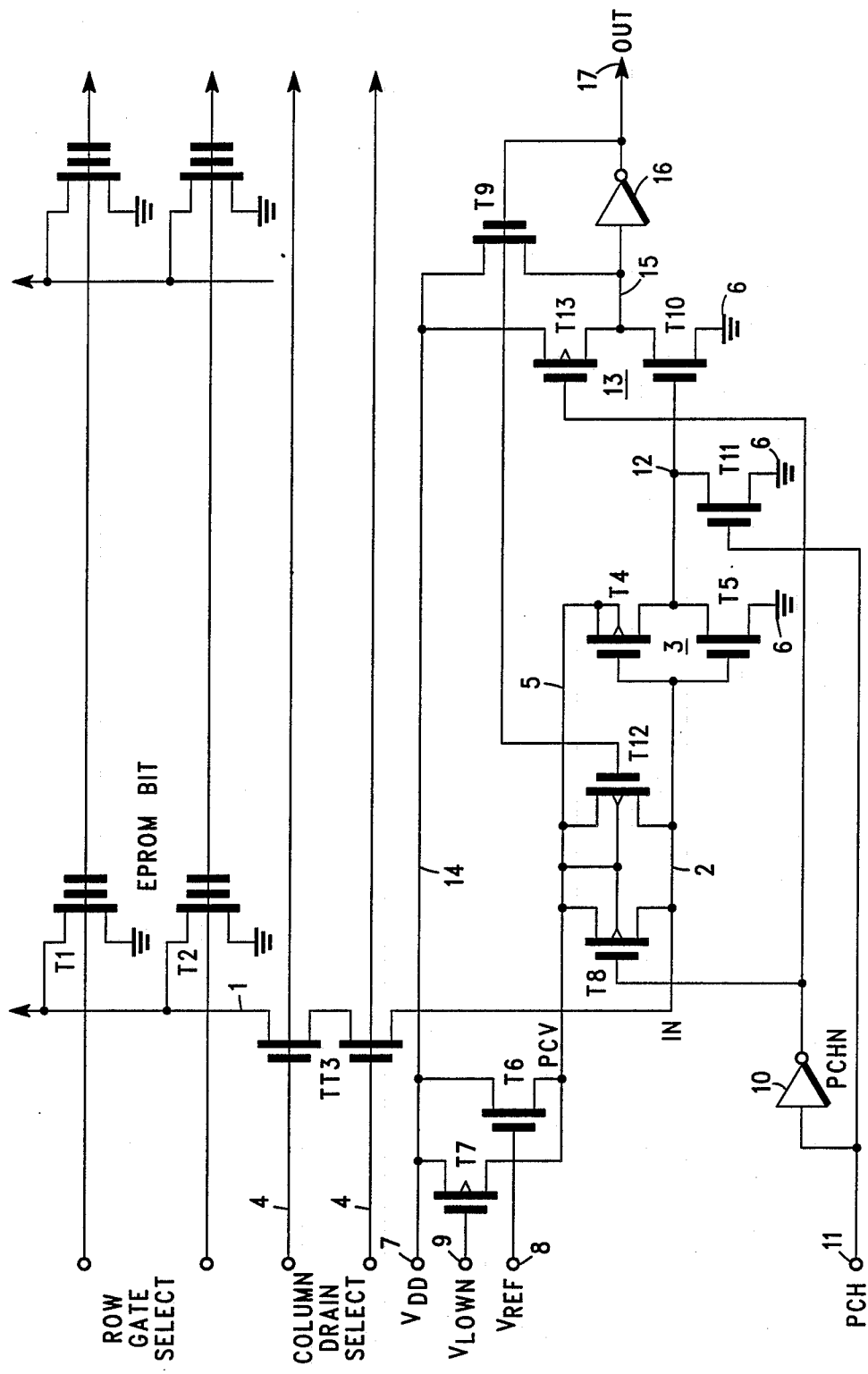

4,965,473

EPROM LOW VOLTAGE SENSE AMPLIFIER

BACKGROUND OF THE INVENTION

The invention relates to a low voltage sense amplifier for an EPROM memory transistor.

In order to read a CMOS EPROM memory transistor forming part of a memory array of rows and columns of transistors, a sense amplifier is coupled to each column.

The drains of the EPROM, transistors, which are connected to the column line, are coupled to the input of the respective sense amplifier. To read a transistor, the column and the input of the sense amplifier are precharged to the main supply voltage VDD.

VDD is typically about 5 volts but in some applications can reach 6 to 8 volts. Precharging the columns to such high voltages can cause some deprogramming of the memory transistors.

This invention seeks to provide a low voltage sense amplifier for an EPROM memory transistor which can operate over a wide range of supply voltage and in which the above mentioned problem is solved.

According to this invention there is provided a low voltage sense amplifier for an EPROM memory transistor comprising a low voltage inverter having an input selectively couplable to the EPROM memory transistor, and an output; means for applying a selectable reference voltage as a supply voltage for the inverter and means responsive to a precharge signal for coupling the selectable reference voltage, as a precharge voltage, to the input of the low voltage inverter.

The means for applying a selectable reference voltage as a supply voltage for the low voltage inverter may comprise a first MOS transistor coupled between a first power supply terminal and a supply line for the inverter, the first MOS transistor having a control electrode for receiving a selectable reference voltage.

The means for coupling the selectable reference voltage as a precharge voltage to the input of the low voltage inverter may comprise a second MOS transistor, coupled between the supply line for the low voltage inverter and the input of the low voltage inverter, and having a control electrode for receiving said precharge signal.

A resistive holding transistor is preferably connected across the second MOS transistor, the holding transistor having a control electrode coupled to be responsive to the output state of the low voltage inverter.

A third MOS transistor may be connected across the said first MOS transistor, the third MOS transistor having a control electrode for receiving a signal indicative of a low supply voltage level of the first power supply, thereby to short circuit the first MOS transistor and couple the first power supply terminal directly to the supply line of the low voltage inverter.

Typically a low-to-high voltage inverter may be provided, coupled to the first power supply terminal and having a low voltage input coupled to the output of the low voltage inverter and having a high voltage output.

In order to speed up switching of the low-to-high voltage inverter in response to the precharge signal, an MOS transistor may be coupled between the low voltage input and a reference terminal, the transistor having a control electrode coupled to receive the precharge signal.

a resistive holding transistor may be coupled between the output of the low-to-high voltage inverter and the first power supply terminal, the transistor having a control electrode coupled to the output of the high voltage inverter via a further inverter.

DESCRIPTION OF DRAWING

An exemplary embodiment of the invention will be described with reference to the single FIGURE drawing which is a circuit schematic of a preferred embodiment of the present invention.

In the drawing, EPROM memory transistors T1 and T2 have their drain electrodes coupled to column line 1 which is coupled via column select transistors TT3 to the input node 2 of a low voltage inverter 3. The column select transistors have their gate electrodes coupled to column select lines 4.

The low voltage inverter is a CMOS inverter formed by series connected p and n-channel MOS transistors T4 and T5 respectively, which are coupled in series between a supply line 5 for the inverter and a ground reference terminal 6.

Power supply for the supply line 5 is derived from an n-channel MOS transistor T6 coupled between a first power supply terminal 7 and the supply line 5. The terminal 7 receives a supply voltage VDD which is typically 5 volts but which may, depending upon application, lie between about 2 v and about 8 v. The gate electrode of the transistor T6 is coupled to a terminal 8 for receiving a selectable reference voltage VREF.

A p-channel MOS transistor T7 is connected across the transistor T6 and has its gate electrode connected to a terminal 9 for receiving a low supply voltage signal VLOWN.

A p-channel MOS transistor T8 is coupled between the supply line 5 and the input node 2 of the low voltage inverter 3. The gate control electrode of the transistor T8 is coupled via an inverter 10 to a terminal 11 for receiving a precharge select logic signal.

The output of the low voltage inverter 3 is coupled to input node 12 of a low-to-high voltage inverter 13. The inverter 13 is formed by a switching n-channel MOS transistor T10 and a p-channel resistive holding transistor T9 which are connected in series between a supply line 14, connected to the power supply terminal 7, and ground reference terminal 6.

The gate electrode of the transistor T10 is coupled to the input node 12 of the inverter 13.

An n-channel MOS transistor T11 is coupled between the input node 12 and ground reference potential and has a gate electrode coupled to the precharge signal terminal 11.

The inverter 13 has an output node 15 which is coupled via an inverter 16 to a final output terminal 17.

A resistive pull-up p-channel MOS transistor T12 is coupled between the supply line 5 and the input node 2 of the low voltage inverter 3. The gate electrode of the resistive pull-up transistor T12 is coupled to that of the transistor T9 and to the output terminal 17. The resistive pull-up transistor 12 is formed in the same semiconductor n-tub as the p-channel transistors T8 and T4 and the substrates of these three transistors are common and are coupled to the supply line 5.

A p-channel transistor T13 is connected in parallel with the resistive holding transistor T9 and has its gate electrode coupled via the inverter 10 to the precharge logic signal input terminal 11.

As explained above, EPROM sense amplifiers, although nominally designed to operate with a 5 volt VDD supply voltage must be capable of handling a supply voltage which can vary, typically between 2 and 8 volts.

In the invention the sense amplifier is formed from a low voltage inverter which receives as its supply voltage a selectable low reference voltage which is also fed as a precharge voltage to the input node of the low voltage inverter and to the columns of the EPROM memory.

In operation a supply VDD, typically 5 v, but possibly lying between about 2 and 8 v, is applied to the terminal 7 and a reference voltage VREF is applied to the terminal 8 and hence to the gate electrode of the transistor T6.

A low supply voltage detection circuit (not shown) senses the supply voltage VDD and provides a signal VLOWN to the terminal 9, which signal is low when the supply voltage is low (typically 3 to 4.5 volts) and high at high voltages.

Thus with high VDD the transistor T7 will be turned off and a voltage VREF - VTN, where VTN is the threshold voltage of an n-channel MOS transistor of the circuit, will be applied as a reference supply voltage PCV to the supply line 5 of the low voltage inverter 3. Typically VREF is chosen to be about 2.7 volts.

If the supply voltage VDD is low the signal VLOWN turns on the transistor T7 and this transistor bypasses the transistor T6 and the reference supply voltage PCV goes to VDD. Thus the low voltage inverter 3, which is coupled to read the EPROM memory bit, is operated by a low voltage of typically less than 3 v. This permits operation of the EPROM at very low supply voltage (below 2 v).

In order to read an EPROM bit the column line 1 is selected by the application of VDD to the gates of the column select transistor TT3 and the input node 2 of the low voltage inverter is first precharged to a precharge voltage. The precharge logic signal PCH applied to terminal 1 goes high and the gate of the p-channel transistor T8 will go low by virtue of the inverter 10. Consequently the transistor T8 will turn on and apply the reference supply voltage PCV to the input node 2 of the low voltage inverter 3. The same precharge voltage is applied to the column 1 of the EPROM memory by a similar arrangement (not shown).

Since the input node 2 of the low voltage inverter 3 is switched high, its output, which is coupled to the input node 12 of the low to high voltage inverter will go low.

The low voltage inverter 3 has a relatively long reaction time and thus to speed up the switching of the transistor T10 of the low-to-high voltage inverter 13, the transistor T11 is provided. On application of the precharge signal to the terminal 11, the gate of the transistor T11 will go high and the transistor T11 will conduct and rapidly switch low the gate of the transistor T10 causing the inverter 13 to change states. Also the gate of T9, which is connected to receive the inverted precharge logic signal via the inverter 10, will go low causing the transistor T13 to turn on and to precharge the output node 15 of the inverter 13 to VDD.

The low-to-high voltage inverter provides the required voltage level conversion from the low voltage of the bit sensing low voltage inverter 3, to the output level required by circuits (typically an MPU) coupled to the output terminal 17 of the sense amplifier.

On switching of the inverter 13, its output node 15 will go high and the final output terminal 17 will be low. The resistive holding transistors T12 and T9 will both be turned on and maintain the precharge voltage level after the precharge signal PCH is removed.

During precharge the gate select lines coupled to the gates of the EPROM transistors T1 and T2 are switched off.

After the precharge phase, one EPROM bit is selected by means of a gate select signal at the VDD supply voltage, which is applied to the gate of the selected EPROM transistor.

Depending upon whether a bit is programmed or not, the column line 1 either will, or will not draw any current.

If no current is drawn the precharge level at the input node 2, of the low voltage inverter 3, will be maintained and the output terminal 17 will stay low. If current is drawn the input node 2 of the inverter 3 will be discharged below its trigger point, in spite of the presence of the holding transistor T12. The low voltage inverter 3 will change states, which will also cause the switching of the low-to-high voltage inverter 13 by turning on the transistor T10. The output terminal 17 will thus be switched to the level of VDD, the supply voltage for the inverter 13.

When the terminal 17 switches to VDD, the resistive pull-up holding transistors T12 and T9 are turned off, thereby shutting off all DC power consumption.

The sense amplifier described has the advantage that the drain precharge voltage can be very tightly controlled (in the example given, below 2 v) and deprogramming during precharge is avoided. DC power consumption is totally avoided and also at the low precharge voltage used, the sense amplifier is faster than any known sense amplifier which draws no DC current.

Also EPROM read operation is possible at very low supply voltage (below 2 v).

The invention has been described by way of example and modifications may be made without departing from the scope of the invention. In particular the voltages given are entirely by way of example and the circuit may be used with other chosen voltages.

We claim:

1. A low voltage sense amplifier for an EPROM memory transistor comprising a low voltage inverter having an input selectively couplable to the EPROM memory transistor and an output; means for applying a selectable reference voltage as a supply voltage for the inverter and means responsive to a precharge signal for coupling the selectable reference voltage, as a precharge voltage, to the input of the low voltage inverter.

2. The sense amplifier of claim 1 wherein the means for applying a selectable reference voltage as a supply voltage for the low voltage inverter comprises a first MOS transistor coupled between a first power supply terminal and a supply line for the inverter, the first MOS transistor having a control electrode for receiving a selectable reference voltage.

3. The sense amplifier of claim 2 wherein the means for coupling the selectable reference voltage as a precharge voltage to the input of the low voltage inverter comprises, a second MOS transistor coupled between the supply line for the low voltage inverter and the input of the low voltage inverter, and having a control electrode for receiving said precharge signal.

4. The sense amplifier of claim 3 wherein a resistive holding transistor is connected across the second MOS transistor, the holding transistor having a control electrode coupled to be responsive to the output state of the low voltage inverter.

5. The sense amplifier of claim 4 wherein a third MOS transistor is connected across the said first MOS transistor, the third MOS transistor having a control electrode for receiving a signal indicative of a low supply voltage level of the first power supply, thereby to short circuit the first MOS transistor and couple the first power supply terminal directly to the supply line of the low voltage inverter.

6. The sense amplifier of claim 5 wherein a low-to-high voltage inverter is provided coupled to the first power supply terminal and having a low voltage input coupled to the output of the low voltage inverter and high voltage output.

7. The sense amplifier of claim 6 wherein a MOS speed-up transistor is coupled between the low voltage input of the low-to-high voltage inverter and a reference terminal, the transistor having a control electrode coupled to receive the precharge signal.

8. The sense amplifier of claim 6 wherein a resistive holding transistor is coupled between the output of the low-to-high voltage inverter and the first power supply terminal, the transistor having a control electrode coupled to the output of the high voltage inverter via a further inverter.

* * * * *